United States Patent
Son et al.

[11] Patent Number: 6,103,554
[45] Date of Patent: Aug. 15, 2000

[54] METHOD FOR PACKAGING INTEGRATED CIRCUITS WITH ELASTOMER CHIP CARRIERS

[75] Inventors: Dae Woo Son; Youn Soo Lee; Byung Man Kim, all of Chungcheongnam-do, Rep. of Korea

[73] Assignee: Samsung Electronics, Co., Ltd., Suwon, Rep. of Korea

[21] Appl. No.: 09/219,015

[22] Filed: Dec. 23, 1998

[30] Foreign Application Priority Data

Jan. 8, 1998 [KR] Rep. of Korea ............................ 98-290

[51] Int. Cl.⁷ ..................... H01L 21/44; H01L 21/48; H01L 21/50; H01L 23/22; H01L 23/24
[52] U.S. Cl. ..................... 438/126; 438/112; 257/687
[58] Field of Search ..................... 438/112, 118, 438/126; 257/696, 687; 29/840

[56] References Cited

U.S. PATENT DOCUMENTS

| | | | |
|---|---|---|---|
| 4,836,955 | 6/1989 | Ehrreich | 252/512 |
| 5,477,611 | 12/1995 | Sweis | 29/840 |
| 5,518,964 | 5/1996 | DiStefano | 437/209 |
| 5,659,952 | 8/1997 | Kovac | 29/840 |
| 5,726,492 | 3/1998 | Suzuki | 257/685 |
| 5,776,796 | 10/1996 | Distefano | 438/106 |
| 5,863,815 | 10/1997 | Egawa | 438/118 |

*Primary Examiner*—Charles Bowers
*Assistant Examiner*—Nema Berezny
*Attorney, Agent, or Firm*—Skjerven, Morrill, MacPherson, Franklin & Friel, LLP; Tejinder Singh

[57] ABSTRACT

A semiconductor chip packaging method includes the provision of individual elastomer chip carriers cut from an elastomer sheet having a uniform thickness and smooth, parallel surfaces. The elastomer sheet is mounted on an adhesive tape held by a fixing member, such as a support ring, and is then divided into individual carriers. The carrier is attached to a circuit interposer, and a semiconductor chip is attached to the carrier. Circuit leads of the interposer are bonded to connection pads on the chip. The beam lead bonding area is then encapsulated, and conductive bumps are formed on the underside of the package to serve as input/output terminals for the packaged device. Using this method, an number of devices can be packaged simultaneously on a flexible sheet and then separated into individual devices by cutting the sheet between the devices.

16 Claims, 9 Drawing Sheets

METHOD FOR PACKAGING INTEGRATED CIRCUITS WITH ELASTOMER CHIP CARRIERS

BACKGROUND

1. Field of the Invention

The present invention relates to semiconductor manufacturing technology, and more particularly, to a method for packaging semiconductor integrated circuit chips using an elastomer chip carrier.

2. Description of the Prior Art

A major trend in the electronics industry today is toward products that are lighter, smaller, faster, more multi-functional, more powerful, more reliable, and less expensive. One of the key technologies for achieving these product goals is that of electronic packaging and assembly. Chip-size package, or chip-scale package, (CSP) is a type of semiconductor package that has recently been developed in response to the above trend. More than ten companies in the U.S.A., Japan, and Korea have developed various technologies for manufacturing various types of CSPs.

One type of CSP is the so-called Micro Ball Grid Array ($\mu$BGA) package introduced by Tessera, Inc. in the U.S. The $\mu$BGA package of Tessera uses a flexible "circuit interposer" and a layer of silicone elastomer. FIG. 1 shows, in partial section, a $\mu$BGA package 10 having an elastomer layer 17.

Referring to FIG. 1, a flexible circuit interposer 16 includes a polyimide dielectric film 13 with conductive through-holes, or vias 18, copper traces 14 and beam leads 15. A layer of elastomer 17 is placed between the flexible circuit interposer 16 and a semiconductor die, or chip 11, with one side of the elastomer 17 being attached to the flexible circuit interposer 16 and the other side of the layer being attached to the chip 11. Conductive traces 14 are connected to the vias 18, and beam leads 15 extending from the traces 14 are bonded to input/output pads 12 on the chip 11. After bonding, the bonding area, including the pads 12 and beam leads 15, are encapsulated with an encapsulant 19 to seal and protect them from the environment. Solder bumps 20 are formed at the vias 18 to define input/output terminals for the package 10.

FIG. 2 depicts the conventional, prior art manufacturing process 30 for manufacturing the $\mu$BGA package 10 illustrated in FIG. 1. The process 30 for manufacturing the pBGA package 10 begins with step 31, in which a flexible circuit interposer 16 is fabricated. In step 31, a photolithography technique widely known in the art is used to form copper traces 14 and beam leads 15 on a polyimide film 13. Vias 18 for conductive solder bumps 20 are also formed in the film 13.

In step 32, an elastomer layer 17 is applied to the flexible circuit interposer 16 by means of a conventional screen printing method and then cured in place. If necessary, the elastomer screen printing process may be repeated until a required thickness of the layer is achieved. In step 33, a microchip 11 is attached to the elastomer 17, and in step 34, the beam leads 15 on the interposer are bonded to input/output pads 12 on the chip.

In step 35, the bonding area is encapsulated with an encapsulant 19, and in step 36, solder bumps 20 are formed at vias 18. A final step 37 may involve the separation, or "singulation," of a plurality of simultaneously fabricated $\mu$BGA packages 10 into individual packages.

Typical CSPs, as well as the particular $\mu$BGA package described above, have a common drawback that relates to the formation of the elastomer layer. When the elastomer layer is formed on the flexible circuit interposer by a conventional screen printing method, a viscous layer of fluid elastomer is applied onto the interposer and then cured in an oven. However, the viscous fluidity of the elastomer may cause certain defects in the carrier, such as voids, a non-uniform thickness, and an overflow of the elastomer. These defects can, for example, prevent the beam leads from bonding to the pads of the chip when the elastomer is either too thick or when it overflows laterally to the extent that it covers the chip pads. In addition, an overflow of the elastomer often degrades the encapsulation, and can even result in a delamination of the device.

SUMMARY OF THE INVENTION

This invention provides a method for manufacturing semiconductor integrated circuit devices having an elastomer chip carrier, and more particularly, a method for forming and incorporating the elastomer chip carrier in the device, that overcomes the above-described problems and others of the prior art.

According to the present invention, a method for manufacturing semiconductor integrated circuit devices incorporating an elastomer chip carrier includes providing an elastomer sheet; dividing the elastomer sheet into multiple individual elastomer chip carriers; attaching the individual elastomer carriers to circuit interposers; attaching semiconductor chips to the individual elastomer chip carriers; bonding the circuit leads of the interposers to the chip pads of the semiconductor chips; and encapsulating the region wherein the circuit leads are bonded to the chip pads.

In particular, the present invention forms the individual elastomer chip carriers from an elastomer sheet having substantially parallel, planar surfaces. Accordingly, the present invention makes it possible to form a reliable elastomer carrier that has a uniform thickness and smooth, even surfaces, thereby eliminating the prior art problems described above caused by a defective elastomer carrier.

The elastomer sheet can be formed in the shape of a wafer and can have the same diameter as a silicon wafer, making it adaptable to current semiconductor manufacturing processes and equipment. In addition, the elastomer sheet can easily be produced in various thicknesses in response to any special requirements. However, a preferable thickness of the elastomer sheet is from about 180 $\mu$m to about 220 $\mu$m.

The elastomer sheet may be attached to an adhesive tape with a fixing member, such as a wafer saw ring, to prevent relative movement of the elastomer sheet during the division of the sheet into individual elastomer carriers. The individual elastomer carriers are attached to circuit interposers by an adhesive, and the chips, in turn, are attached to the individual elastomer carriers by a melting of the carriers. The encapsulating step of the invention may include the provision of a cover film and dispensing a liquid encapsulant.

The manufacturing method in accordance with the present invention may further include the step of forming conductive bumps after the encapsulating step. The conductive bumps are formed at the vias of the circuit interposers. In addition, the method of the present invention may further include the step of separating individual semiconductor devices from a plurality of simultaneously fabricated devices.

DETAILED DESCRIPTION OF THE PREFERRED EMBODIMENTS

The present invention will now be described more fully hereinafter with reference to the accompanying drawings, in which exemplary embodiments of the invention are shown. This invention may, however, be embodied in other, different forms and should not be construed as being limited to the particular embodiments described and illustrated herein. Throughout the drawings, it is intended that like numbers refer to like elements.

Figure 2:
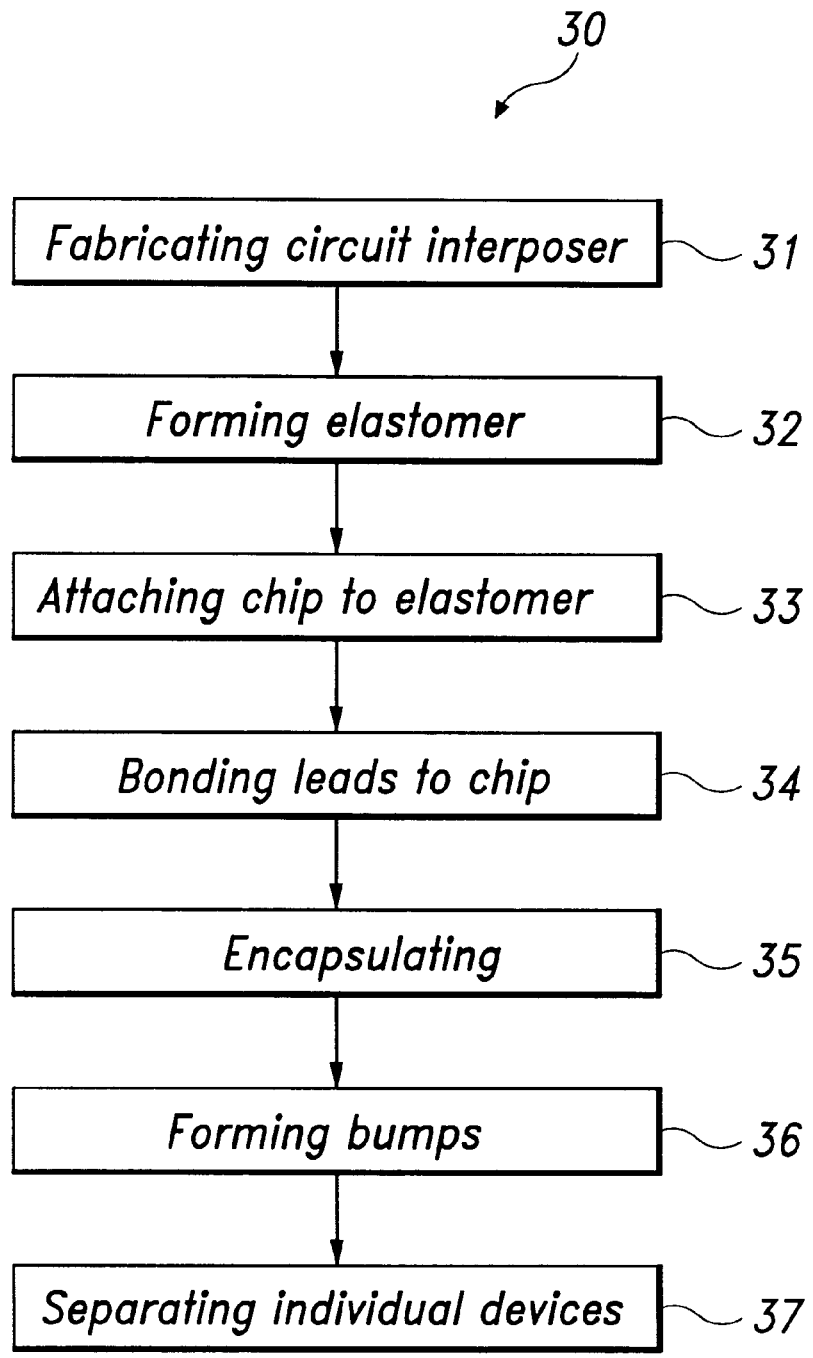
FIG. 2 is a flow diagram of the conventional, prior art method for manufacturing the device shown in FIG. 1.
Figure 3:
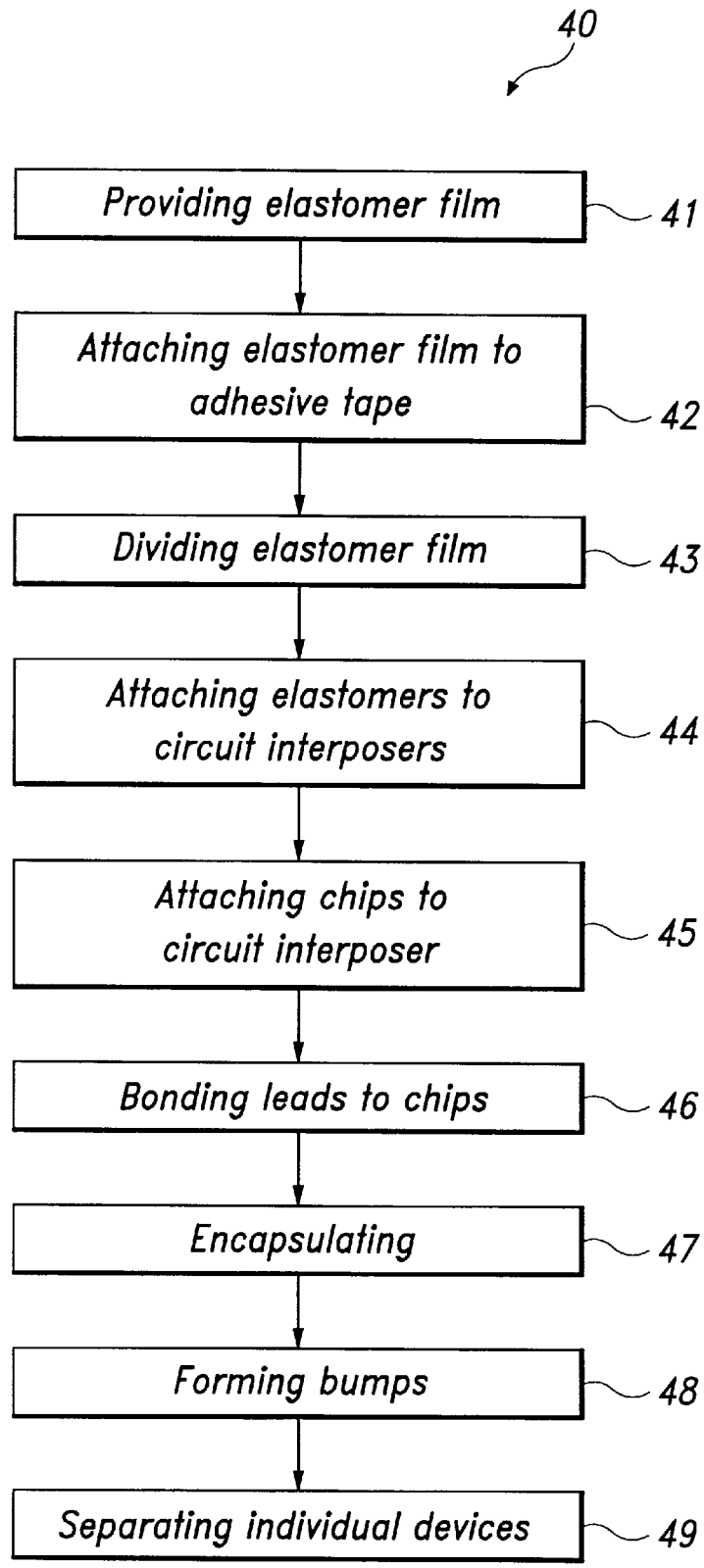
FIG. 3 is a flow diagram of a method for manufacturing a semiconductor integrated circuit device having an elastomer carrier according to the present invention.

FIG. 3 is a flow diagram of a manufacturing method 40 for manufacturing a semiconductor integrated circuit device according to the present invention. The manufacturing process 40 shown in FIG. 3 and the conventional manufacturing method 30 shown in FIG. 2 are distinguishable from each other primarily by the respective processes employed by the two methods to form and incorporate the elastomer chip carrier into the device. While the conventional method forms elastomers directly on the circuit interposer by screen-printing and curing a viscous layer of a fluid elastomer on the interposer, the novel method 40 of the present invention divides an already-formed elastomer sheet into individual elastomer carriers and then attaches the individual carriers to the circuit interposer.

Figure 4:
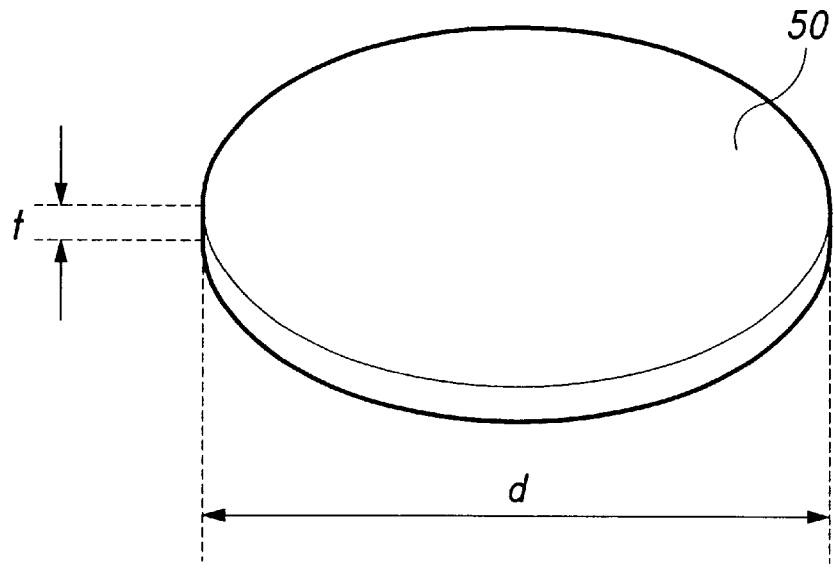
FIG. 4 is a perspective view of an elastomer sheet according to the method of the present invention.

With reference to FIG. 3, step 41 involves the provision of an elastomer sheet 50, as seen in FIG. 4, namely, a wafer-like sheet which has substantially smooth, parallel planar surfaces. The diameter (d) of the elastomer sheet 50 is preferably the same as that of a conventional silicon wafer, which enables the elastomer sheet to be easily adapted to current semiconductor manufacturing techniques and equipment, including automated wafer-sawing and pick-and-place techniques. In addition, the wafer-like elastomer sheet 50 can easily be formed in various thicknesses in response to special design requirements, whereas the conventional screen-printing method cannot produce a relatively thick, yet uniform elastomer sheet. Also, since the wafer-like elastomer sheet 50 has a uniform thickness and a smooth, even surface, the problems of the prior art related to the elastomer are effectively eliminated. The preferable thickness (t) of the wafer-like elastomer sheet 50 is from about 180 $\mu$m to about 220 $\mu$m. Silicone is preferably used as the material of the elastomer sheet; however, other resilient materials also can be used, depending on the particular problem at hand.

Figure 5:
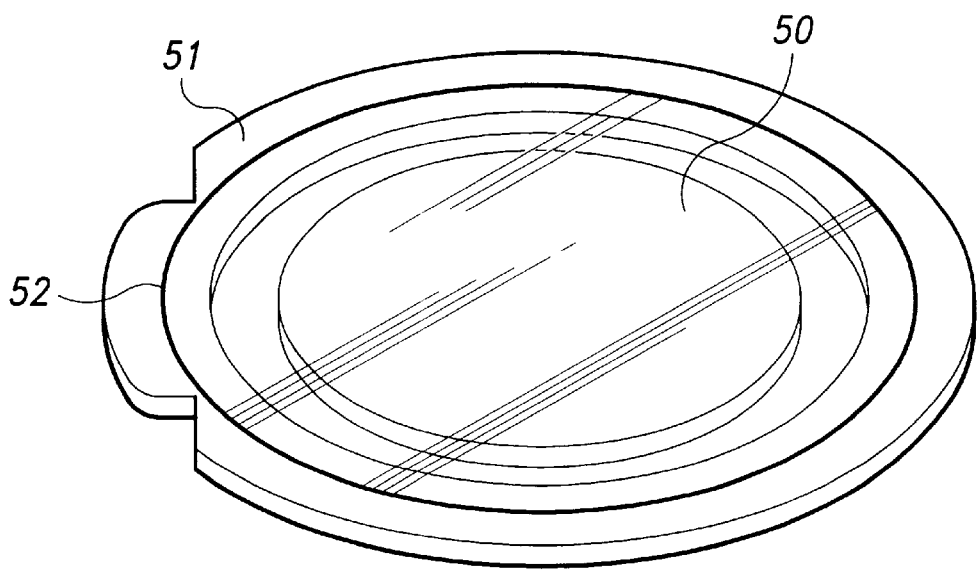
FIG. 5 is a perspective view of the elastomer sheet in FIG. 4 attached to a fixing member through the agency of an adhesive tape.

In step 42, as depicted in FIG. 5, the elastomer sheet 50 is attached to an adhesive tape 52, and the adhesive tape 52 is then fixed to a fixing member 51. The adhesive tape 52 and the fixing member 51 serve to prevent the sheet 50 from moving during the division of the elastomer sheet into individual chip carriers, as described below. Although a support ring made of metal is preferably used as fixing member 51, other equivalent elements can be used as alternatives.

Figure 6:
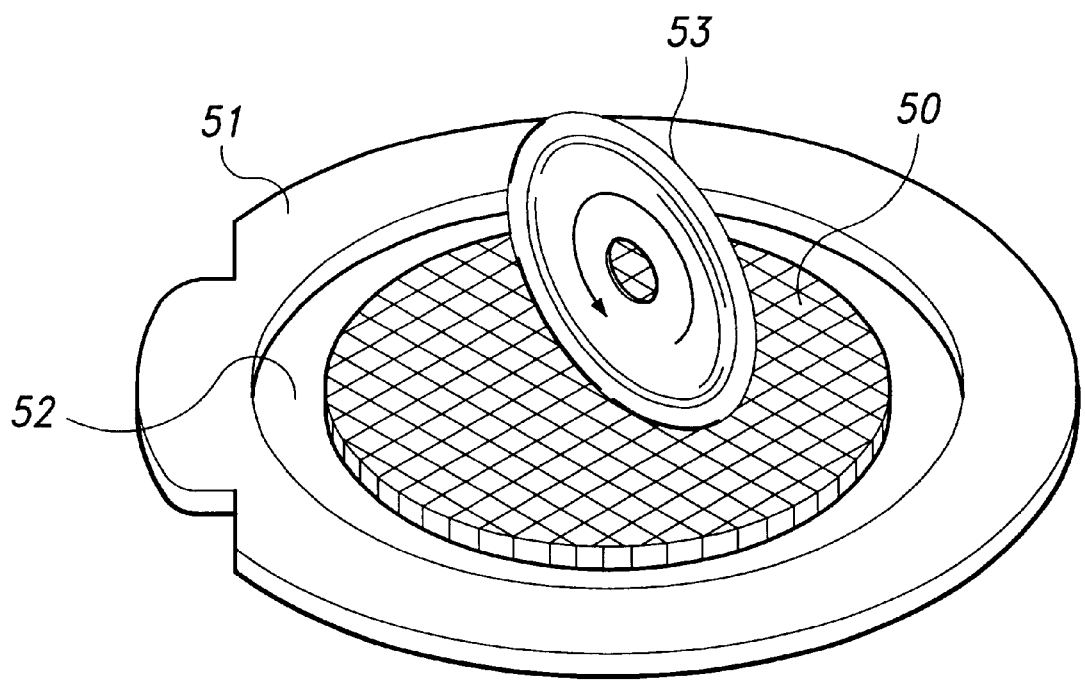
FIG. 6 is a perspective view of the elastomer sheet in FIG. 4 being divided into individual elastomer carriers.

In step 43, the waferlike elastomer sheet 50 is positioned to overlie the tape 52, as illustrated in FIG. 6. The elastomer sheet 50 is then divided to individual elastomer chip carriers 57 whose size is determined by that of a semiconductor chip 58 that is be mounted to the carrier. An ordinary semiconductor wafer saw blade 53 can be used for this dividing step 43.

Figure 1:
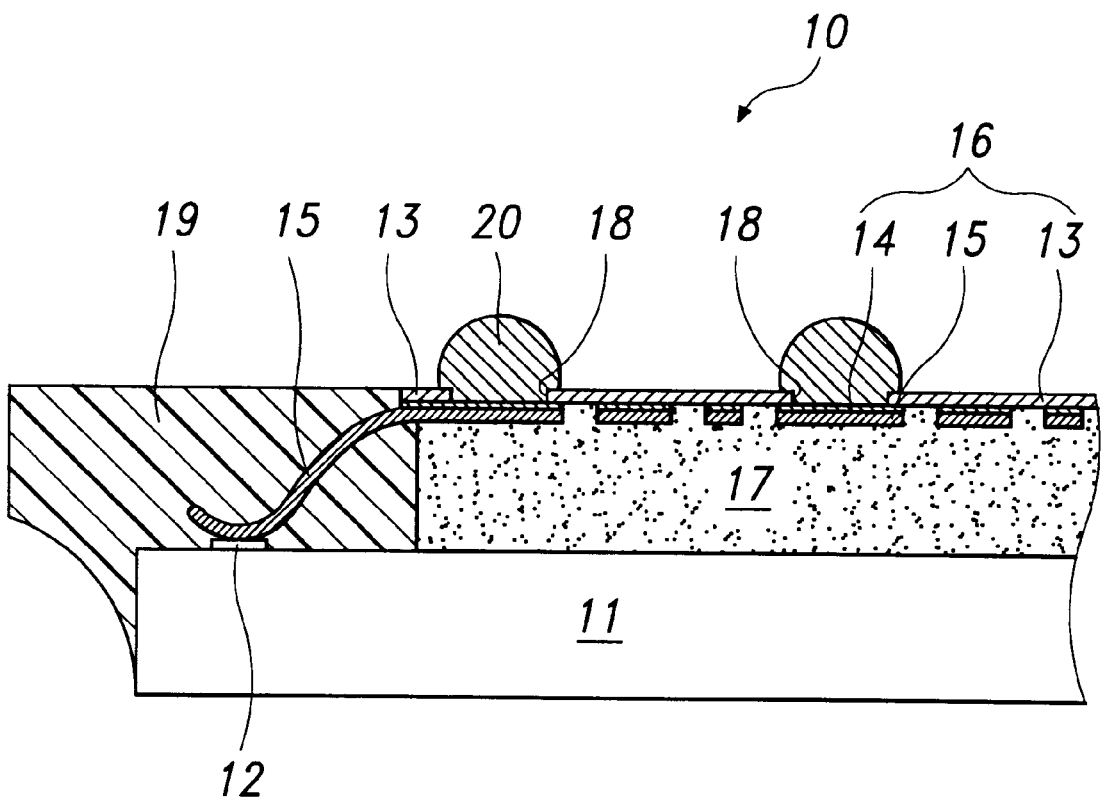
FIG. 1 is a partial cross-sectional view of a typical semiconductor integrated circuit device having an elastomer carrier, as fabricated by the prior art method.
Figure 7:
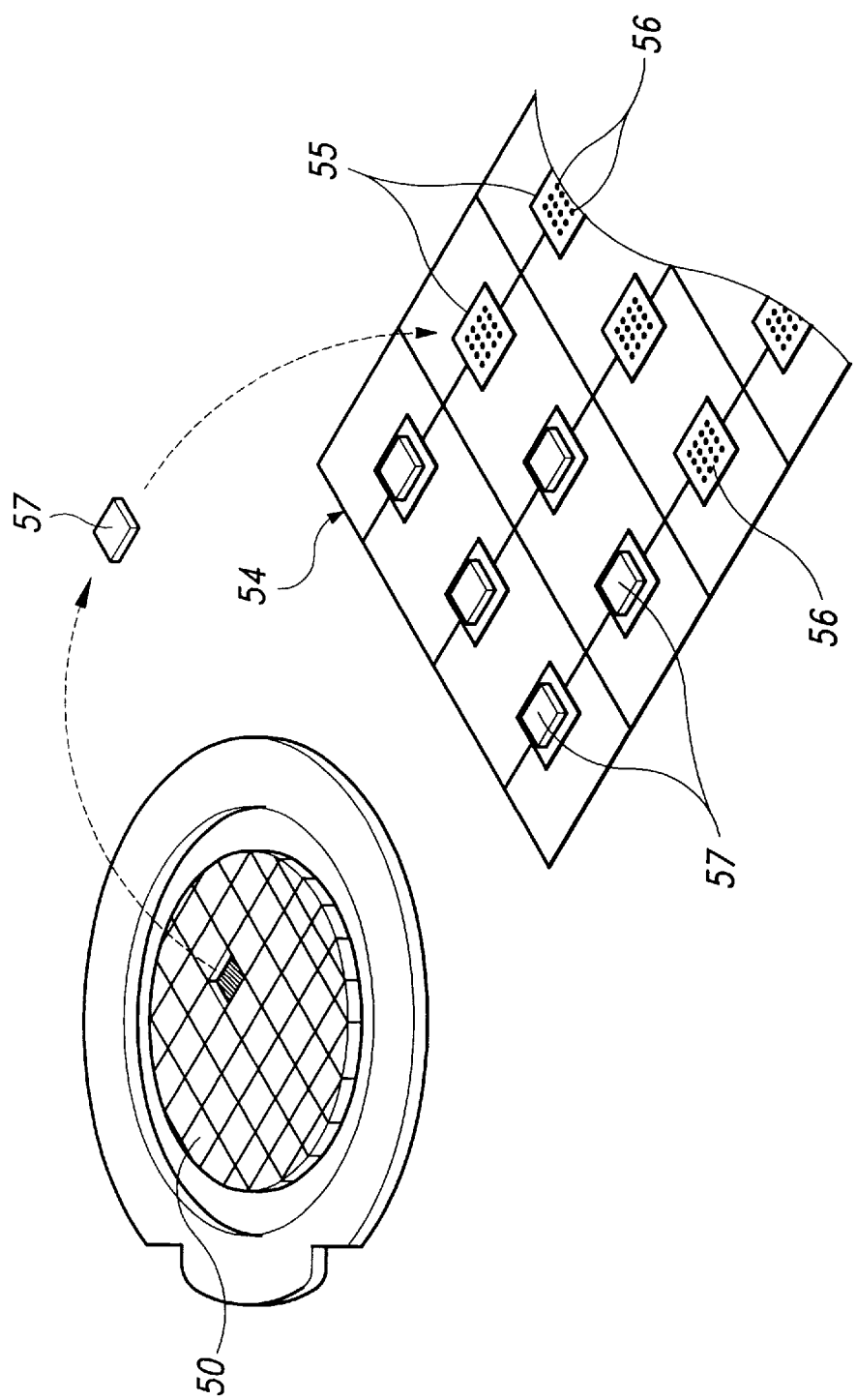
FIG. 7 is a perspective view an individual elastomer carrier shown in FIG. 6 being attached to a circuit interposer according to the method of the present invention.

In step 44, the individual elastomers 57 are attached to a flexible circuit sheet 54, which may be achieved by automated pick-and-place techniques. The flexible circuit sheet includes an array of circuit interposers 55, as shown schematically in FIG. 7. The structure, material and fabrication of the circuit interposers 55 are the same as those of the conventional interposer shown in FIG. 1. Thus, the circuit interposer 55, as illustrated in FIG. 8B, generally includes a polyimide film 55a, copper traces 55b formed on the film, circuit leads 55c, and vias 55d for receiving conductive bumps. In attaching individual elastomer carriers 57 to the circuit interposers 55, an adhesive 56 can be applied to the surface of circuit interposers 55 at locations where individual elastomer carriers 57 are to be attached. For example, an epoxy or a silicone resin adhesive can be dotted or printed on the surface and, if necessary, cured in an appropriate manner.

Figure 8A:
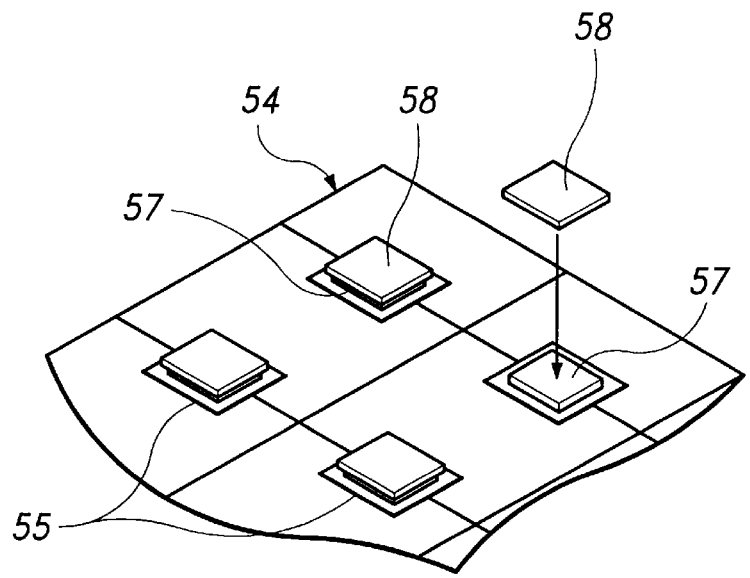
FIG. 8A is a schematic perspective view of the attachment of a semiconductor chip to the individual elastomer carrier shown in FIG. 7 according to the method of the present invention.
Figure 8B:
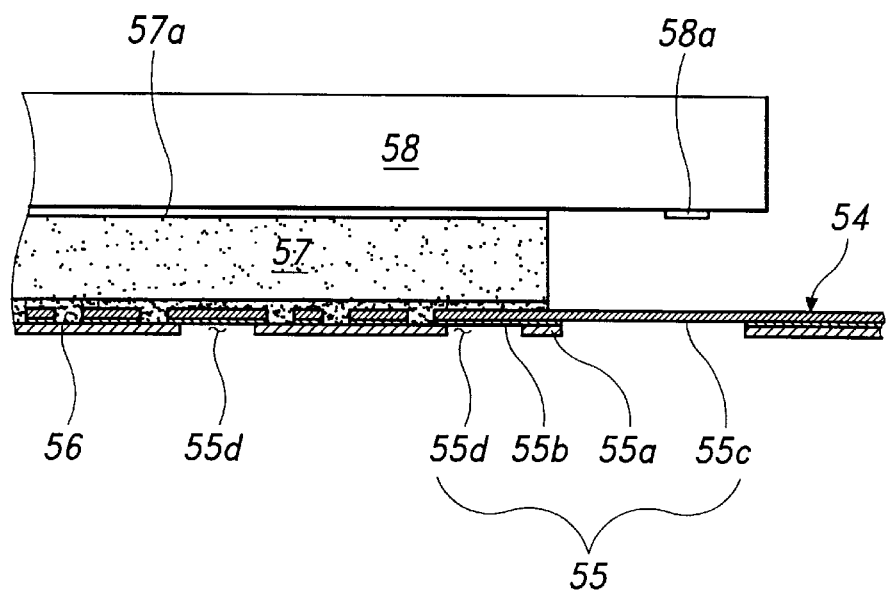
FIG. 8B is a partial cross-sectional view of the semiconductor chip shown in FIG. 8A after its attachment to the circuit interposer by means of the elastomer carrier of the present invention.

After the elastomer carriers 57 are adhered to the circuit interposers 55 on the flexible sheet 54, a semiconductor chip 58 is attached to each circuit interposer 55 through the agency of the elastomer carriers 57, as schematically shown in FIG. 8A, step 45 of FIG. 3. FIG. 8B shows a cross-sectional view of the chip 58, the circuit interposer 55 and the elastomer carrier 57 after step 45 is completed. The chip 58 includes a number of chip pads 58a formed on an active surface of the chip 58, and the active surface is attached to the elastomer chip carrier 57. Although an adhesive can optionally be used for attaching the chip 58 to the elastomer carrier 57, a more direct and efficient attachment between the chip 58 and the elastomer carrier 57 can be achieved by heating the backside, i.e, the inactive side, of the chip 58. That is, after the chip 58 is placed on the elastomer carrier 57, the back side of chip 58 can be heated to about 140° C., which will partially melt an upper portion 57a of the elastomer carrier 57. The simultaneous application of pressure to the chip 58 and/or the circuit interposer 55 results in a bonding between the chip 58 and the elastomer carrier 57.

Figure 9:
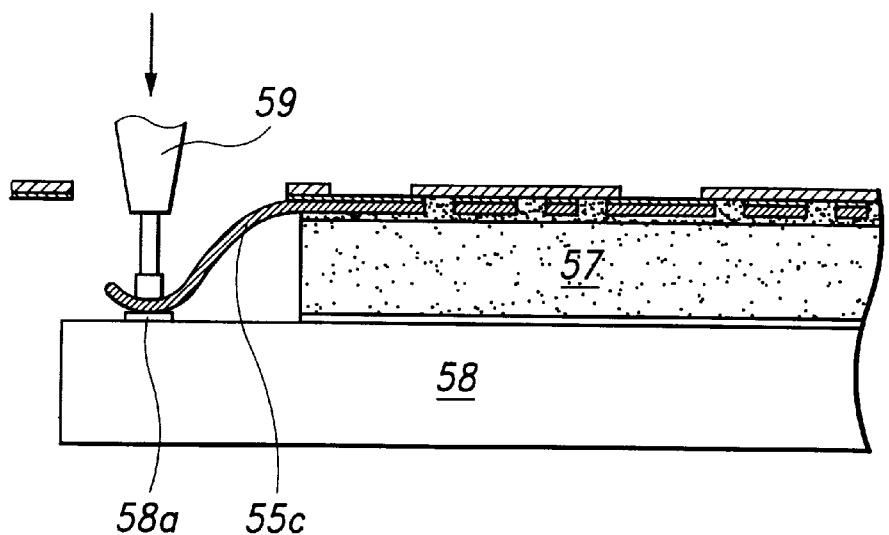
FIG. 9 is a cross-sectional view of bonding the circuit leads of the circuit interposer to bonding pads on the chip according to the method of the present invention.

FIG. 9 illustrates step 46 of FIG. 3 in which the circuit leads 55c are bonded to the chip pads 58a by means of a bonding tool 59. Preferably, notches are formed at a distal end of the circuit leads 55c during fabrication such that, when the tool 59 presses the circuit leads 55c down against the chip pads 58a, the circuit leads 55c will easily snap at the notches, thereby eliminating the need to cut or trim the leads 55c away from the circuit interposer 55 after they are bonded to chip.

Figure 10:
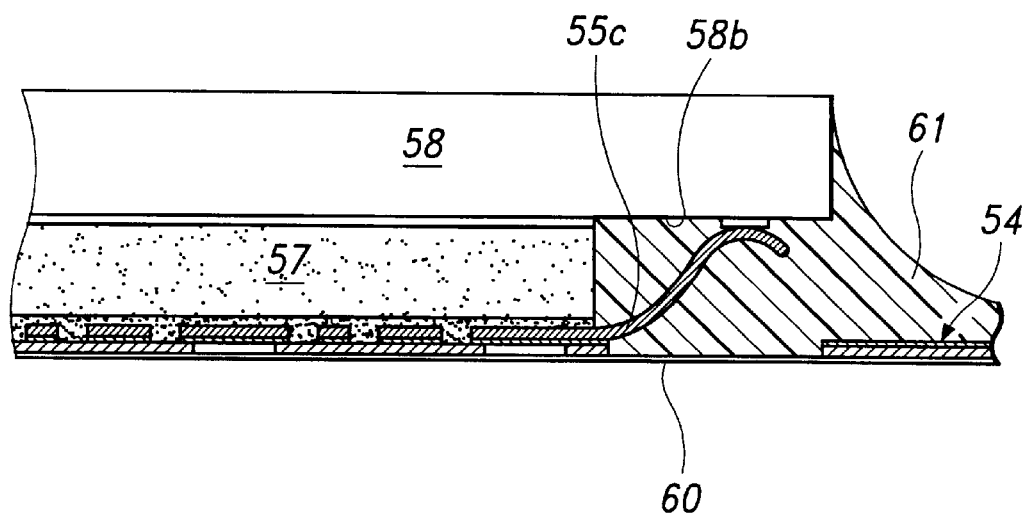
FIG. 10 is a cross-sectional view of encapsulating the bonding area of the circuit leads and the chip pads in FIG. 9 according to the method of the present invention.

After circuit lead bonding, the circuit lead bonding area is encapsulated in step 47, as shown in FIG. 10. Preferrably, the active surface 58b of the chip 58, including the chip pads 58a and the circuit leads 55c bonded to the chip pads 58a, are encapsulated with an encapsulant 61. Preferably, a dispensing method is used in step 47. In other words, a liquid encapsulant 61, for example, epoxy or silicone, is dispensed around the periphery of the chip and into the circuit bonding area and then cured. Additionally, the step of encapsulating may employ a cover film to control the flow of the dispensed encapsulant during encapsulation. The cover film 60 covers the underside of the flexible sheet 54 and/or the circuit interposers 55 to prevent leakage of the encapsulant 61 through any openings in them. The material of the cover film 60 and/or the adhesive by which it is attached to the flexible sheet 54 or the circuit interposer 55 can be selected such that the film 60 can later be easily separated from the flexible sheet 54 by, e.g., the application of heat, such as that used to cure the encapsulant 61.

Figure 11:
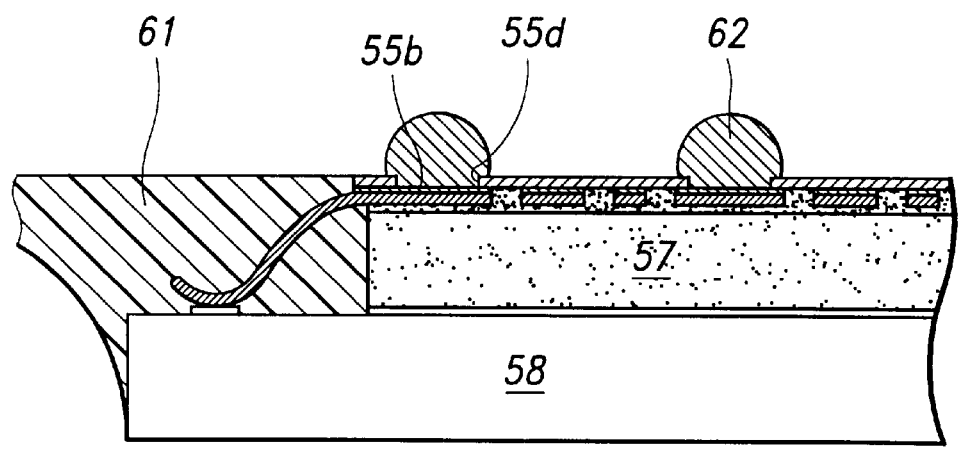
FIG. 11 is a cross-sectional view of forming metallic bumps at the vias according to the method of the present invention; and, FIG. 12 is a cross-sectional view of separating individual semiconductor devices from a sheet of connected devices according to the present invention.

After encapsulation, conductive bumps 62, which serve as input/output terminals for the devices, are formed at vias 55d, as shown in FIG. 11, step 48 of FIG. 3. The conductive bumps 62 can be formed by a reflow technique after a screen-printing of a metal paste, or the mechanical placement of metal balls, on vias 55d. Solder, nickel, gold, or alloys thereof can be used for the conductive bumps 62.

Figure 12:
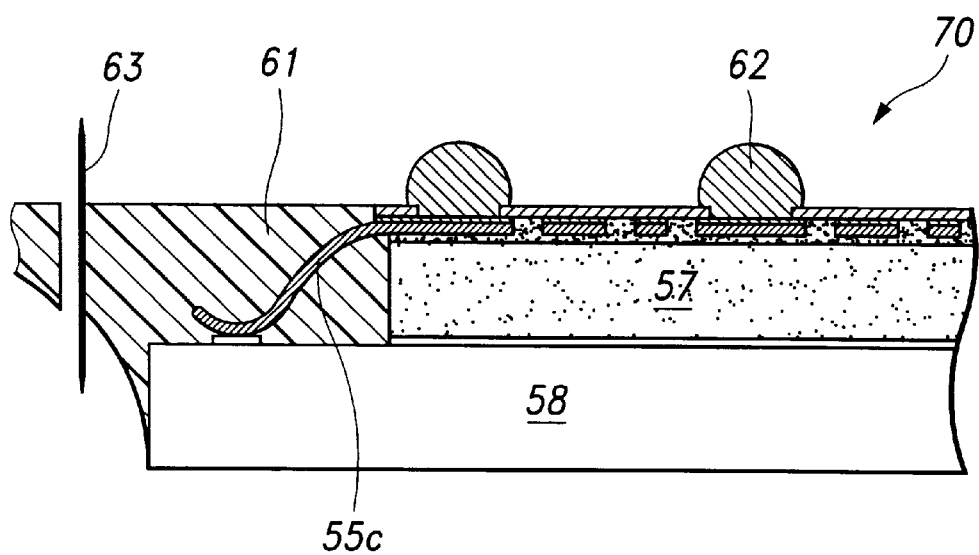

In the final step, step 49 in FIG. 3, and as depicted in FIG. 12, the individual semiconductor devices 70 are separated from the flexible sheet 54 in a cutting, or singulation, procedure in which a cutter 63 cuts the flexible sheet 54 along the periphery of the individual semiconductor devices 70 to separate them into individual units.

Those skilled in the art will by now recognize that, depending on the particular problem at hand, certain advantageous modifications and substitutions can be made to the materials, apparatus, and methods of the present invention without departing from its scope. Accordingly, the scope of this invention should not be considered as limited to the particular embodiments described and illustrated herein, which are merely exemplary in nature, but rather, by the claims appended hereafter.

What is claimed is:

1. A method for packaging a semiconductor integrated circuit device, comprising:

provided an already formed elastomer sheet having parallel substantially planar surfaces and a wafer like shape having a diameter that is about the same as the diameter of a silicon wafer;

dividing the already formed elastomer sheet into a plurality of individual elastomer chip carriers, the dividing includes the sub-steps;

attaching the elastomer sheet to an adhesive tape;

fixing the adhesive tape to a fixing member; and cutting the elastomer sheet into the plurality of individual elastomer chip carriers;

attaching the elastomer carriers to a circuit interposer, the circuit interposer comprising a plurality of circuit leads;

attaching a semiconductor chip having connection pads on a surface thereof to the elastomer carrier so that the pad-containing surface of the chip faces toward the elastomer carrier, and such that the pads on the chip are exposed;

bonding the circuit leads to the pads on the chip; and encapsulating the chip in a region in which the circuit leads are bonded to the pads on the chip.

2. The method of claim 1, wherein the elastomer sheet has a thickness of from about 180 µm to about 220 µm.

3. The method of claim 1, wherein the elastomer carrier is attached to the circuit interposer by an adhesive.

4. The method of claim 1, wherein attaching the semiconductor chip to the elastomer carrier comprises:

placing the chip in contact with the carrier;

heating the chip until a portion of the carrier melts; and, applying pressure to at least one of the chip and the carrier to force them together.

5. The method of claim 4, wherein the chip is heated to a temperature of about 140° C.

6. The method of claim 1, wherein encapsulating the chip further comprises dispensing a liquid encapsulant into the region in which the circuit leads are bonded to the pads on the chip.

7. The method of claim 6, further comprising disposing the circuit interposer over a cover sheet to prevent leakage of the encapsulant.

8. The method of claim 1, wherein the circuit interposer further includes a plurality of vias.

9. The method of claim 8, further comprising forming a plurality of conductive bumps at the vias.

10. The method of claim 1 wherein a plurality of semiconductor integrated circuit devices are simultaneously packaged in an array on a flexible circuit sheet, and further comprising cutting the flexible circuit sheet along a periphery of the devices to separate them into individual devices.

11. A method for packaging a semiconductor integrated circuit device having an elastomer chip carrier, the method comprising;

providing an already formed elastomer sheet having parallel, substantially planar surfaces;

attaching the already formed elastomer sheet to an adhesive tape;

fixing the adhesive tape to a fixing member; and dividing the already formed elastomer sheet into a plurality of individual elastomer chip carriers.

12. The method of claim 11, further comprising:

forming a circuit interposer comprising a non-conductive film having at least one conductive lead on it;

adhering at least one of the elastomer carriers to the circuit interposer;

providing a semiconductor chip having at least one connection pad on a surface thereof;

attaching the surface of the chip having the at least one connection pad on it to the at least one elastomer chip carrier such that the connection pad is exposed; and, bonding the conductive lead to the connection pad.

13. The method of claim 12, wherein attaching the surface of the semiconductor chip to the elastomer carrier further comprises:

pressing the chip and the carrier into contact with each other; and, heating the semiconductor chip until a portion of the carrier melts.

14. The method of claim 12, further comprising dispensing an encapsulant around the semiconductor chip to encapsulate a region in which the conductive lead is bonded to the connection pad on the chip.

15. The method of claim 14, further comprising adhering a cover film to the underside of the circuit interposer to prevent leakage of the encapsulant therethrough.

16. The method of claim 12, wherein the circuit interposer is formed to include at least one via.

* * * * *